(12) United States Patent
Wan et al.

(10) Patent No.: US 10,284,074 B2
(45) Date of Patent: May 7, 2019

(54) LOAD SWITCH AND METHOD OF SWITCHING SAME

(71) Applicant: NXP B.V., Eindhoven (NL)

(72) Inventors: Mingliang Wan, Shanghai (CN); Tinghua Yun, Shanghai (CN); Jian Qing, Shanghai (CN); Peter Christiaans, San Jose, CA (US)

(73) Assignee: NXP B.V., San Jose, CA (US)

( * ) Notice: Subject to any disclaimer, the term of this patent is extended or adjusted under 35 U.S.C. 154(b) by 60 days.

(21) Appl. No.: 15/706,763

(22) Filed: Sep. 18, 2017

(65) Prior Publication Data

US 2019/0036444 A1   Jan. 31, 2019

(30) Foreign Application Priority Data

Jul. 31, 2017   (CN) .......................... 2017 1 0644371

(51) Int. Cl.
*H02M 1/32* (2007.01)
*H02H 7/122* (2006.01)
*H01L 27/02* (2006.01)
*H03K 17/06* (2006.01)
*H02H 3/18* (2006.01)
*H02H 9/04* (2006.01)
*H03K 17/30* (2006.01)
(Continued)

(52) U.S. Cl.
CPC .......... *H02M 1/32* (2013.01); *H01L 27/0285* (2013.01); *H02H 3/18* (2013.01); *H02H 7/1225* (2013.01); *H02H 9/04* (2013.01); *H03K 17/063* (2013.01); *H03K 17/16* (2013.01); *H03K 17/302* (2013.01); *H03K 17/04* (2013.01); *H03K 17/04106* (2013.01); *H03K 2017/066* (2013.01); *H03K 2017/307* (2013.01)

(58) Field of Classification Search
CPC ... G05F 1/10; G05F 1/267; G05F 1/46; G05F 1/561; G05F 1/567; G05F 1/569; G05F 1/571; G05F 1/573; G05F 1/5735; G05F 1/461; G05F 1/462; G05F 1/463; G05F 1/465; G05F 1/466; G05F 1/467; G05F 1/56; G05F 1/562; G05F 1/563; G05F 1/565; G05F 1/575; G05F 1/577; H02M 1/32; H03K 17/063; H03K 17/302; H03K 17/16; H03K 2017/307; H03K 2017/066; H02H 7/1225; H02H 9/04; H02H 3/18; H01L 27/0285
See application file for complete search history.

(56) References Cited

U.S. PATENT DOCUMENTS 6,501,321 B2   12/2002   Kumagai
6,734,704 B1   5/2004   Burkland
(Continued)

*Primary Examiner* — Bryan R Perez
(74) *Attorney, Agent, or Firm* — Charles E. Bergere

(57) ABSTRACT

A load switch includes a switch element and first and second control circuits. The switch element has an input terminal for receiving an input voltage, an output terminal for providing an output voltage, and a control terminal for receiving a switch signal, which turns the switch element on and off. The first control circuit is connected to the control terminal of the switch element and turns off the switch element in response to a first control signal. The second control circuit also is connected to the control terminal of the switch element and keeps the switch element turned off, after the first control circuit has turned off the switch element.

15 Claims, 5 Drawing Sheets

(51) Int. Cl.
  *H03K 17/16* (2006.01)
  *H03K 17/041* (2006.01)
  *H03K 17/04* (2006.01)

(56) References Cited

U.S. PATENT DOCUMENTS

| | | |
|---|---|---|
| 7,382,172 B2 | 6/2008 | Lin et al. |
| 7,463,071 B2 | 12/2008 | Ribarich |
| 9,112,494 B2 | 8/2015 | Kartal |
| 2009/0273331 A1* | 11/2009 | Inoue .................... G05F 1/575 323/312 |
| 2014/0252861 A1* | 9/2014 | Zhou ........................ H02J 4/00 307/64 |
| 2015/0042302 A1* | 2/2015 | Forghani-zadeh ...... G05F 1/573 323/282 |
| 2017/0187374 A1* | 6/2017 | Heo .................. H03K 17/6872 |

* cited by examiner

LOAD SWITCH AND METHOD OF SWITCHING SAME

BACKGROUND

The present invention generally relates to a load switch and a method of switching the load switch, and, more particularly, to a load switch with fast turn-off capability.

Load switches are normally used for connecting and disconnecting a supply voltage to/from a load, under the control of a switch signal. Load switches usually include a high-voltage transistor that is switched on and/or off in order to perform the connection/disconnection. To switch the high-voltage transistor, its gate terminal is coupled to a gate control signal (i.e., the switch signal). A level shifter circuit typically is used to provide the gate control signal. It would be advantageous to have a load switch that is both fast and has low static current to reduce power requirements of the switch.

SUMMARY

This summary is provided to introduce a selection of concepts in a simplified form that are further described below in the Detailed Description. This summary is not intended to identify key or essential features of the claimed subject matter, nor is it intended to be used to limit the scope of the claimed subject matter.

In one embodiment, the present invention provides a load switch that includes a switch element, and first and second control circuits. The switch element has an input terminal for receiving an input voltage, an output terminal that provides an output voltage, and a control terminal for receiving a switch signal. The switch element is switched on and/or off in response to the switch signal. The first control circuit has an input terminal for receiving a first control signal and an output terminal coupled to the control terminal of the switch element. The first control circuit, in response to the first control signal being turn-off, provides the control terminal of the switch element with the switch signal to turn off the switch element. The second control circuit has an input terminal for receiving a second control signal and an output terminal coupled to the control terminal of the switch element. The second control circuit, in response to the second control signal being off, provides the control terminal of the switch element with the switch signal to keep the switch element off after the first control circuit has provided the switch signal to switch off the switch element.

In another embodiment, the present invention provides a method for switching a load switch that includes a switch element. The method includes providing a first control signal to a first control circuit coupled to a control terminal of the switch element; providing from the first control circuit a switch signal to the switch element; providing a second control signal to a second control circuit coupled to the control terminal of the switch element; providing from the second control circuit the switch signal to the switch element; using the switch signal provided from the first control circuit to turn off the switch element in response to the first control signal being at a turn-off level; and using the switch signal provided from the second control circuit to keep the switch element off after the switch element has been turned off by the switch signal provided from the first control circuit.

BRIEF DESCRIPTION OF THE DRAWINGS

So that the manner in which the above recited features of the present invention can be understood in detail, a more detailed description of the invention may be had by reference to embodiments, some of which are illustrated in the appended drawings. The appended drawings illustrate only typical embodiments of the invention and should not limit the scope of the invention, for the invention may admit to other equally effective embodiments. The drawings are for facilitating an understanding of the invention and thus are not necessarily drawn to scale. Advantages of the subject matter claimed will become apparent to those skilled in the art upon reading this description in conjunction with the accompanying drawings, in which like reference numerals have been used to designate like elements, and in which:

DETAILED DESCRIPTION

Figure 1:
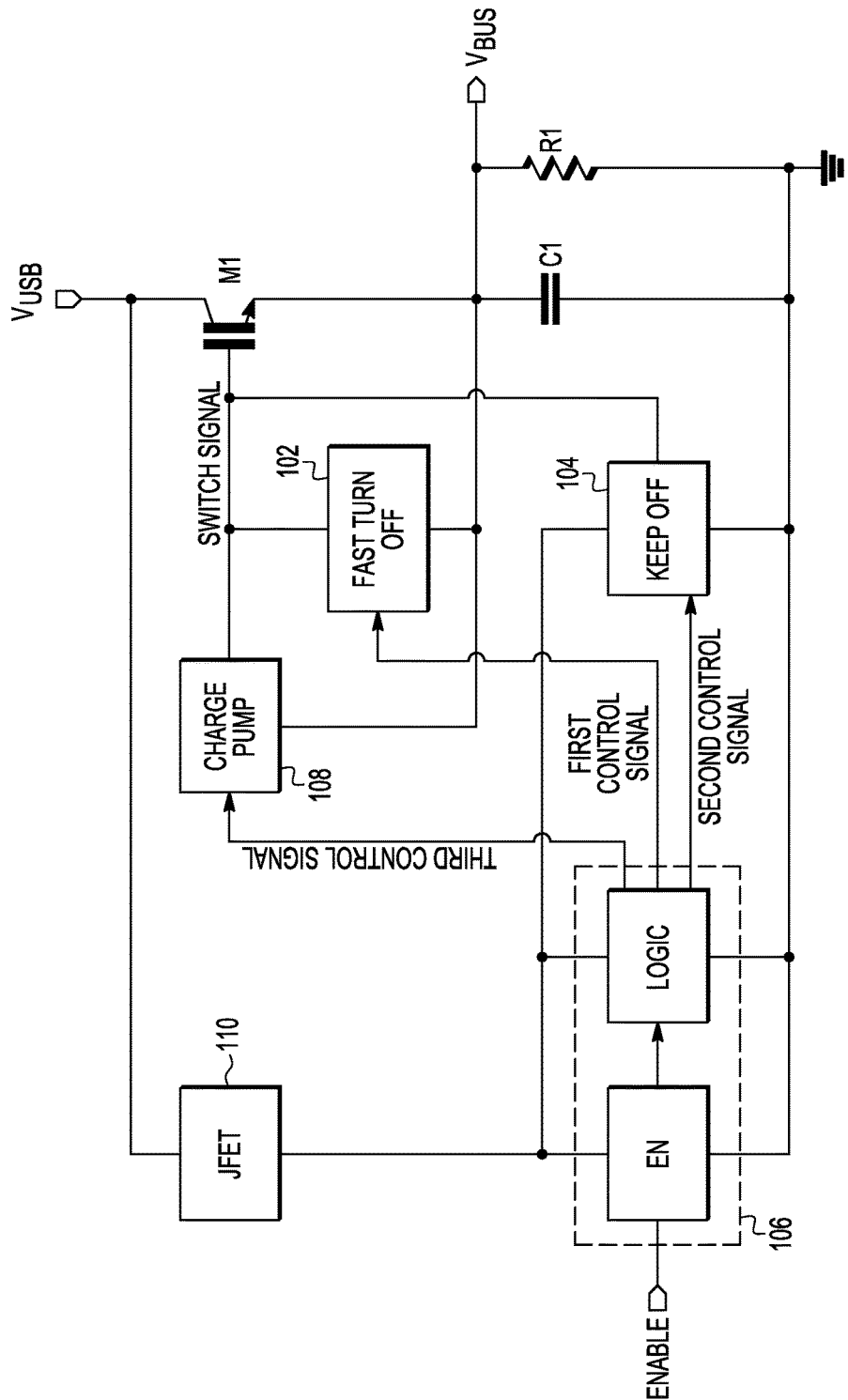
FIG. 1 is a schematic block diagram of a load switch in accordance with an exemplary embodiment of the present invention.

FIG. 1 is a block diagram of a load switch 100 in accordance with an exemplary embodiment of the present invention. In this embodiment, the load switch 100 is coupled between a supply voltage $V_{USB}$ and an output voltage $V_{BUS}$. The supply voltage $V_{USB}$ is provided from a USB port, although it will be understood by those of skill in the art that the supply voltage may be provided from other sources, while the output voltage $V_{BUS}$ is provided to a bus. In one embodiment, the supply voltage $V_{USB}$ is greater that 12V, and the output voltage $V_{BUS}$ is in the range of 3V-5V.

The load switch 100 includes a switch element M1 coupled between the supply voltage $V_{USB}$ and the output voltage $V_{BUS}$, for converting the supply voltage $V_{USB}$ to the output voltage $V_{BUS}$. In the current embodiment, the switch element M1 is shown and exemplarily described as a switch transistor M1. A drain terminal of the switch transistor M1 is coupled to the supply voltage $V_{USB}$, a source terminal of the switch transistor M1 is coupled to provide the output voltage $V_{BUS}$, and a gate terminal of the switch transistor M1 is coupled to receive a switch signal. The switch transistor M1 is controlled by the switch signal to be either conductive or turned-off in order to connect or disconnect the supply voltage $V_{USB}$ and the output voltage $V_{BUS}$. When the switch transistor M1 is conductive, a voltage across a resistor R1 connected between the source terminal of the switch transistor M1 and ground is provided as the output voltage $V_{BUS}$.

The load switch 100 further comprises a fast turn-off or first control circuit 102 and a keep-off or second control circuit 104. The first control circuit 102 has an input terminal that receives a first control signal, and an output terminal coupled to a control terminal of the switch element M1, which in the current embodiment is the gate terminal of the switch transistor M1. The first control circuit 102 operates to quickly turn-off the switch element M1 by providing the switch signal at the gate of the transistor M1 when the first control signal is at a turn-off level.

The second control circuit 104 has an input terminal that receives a second control signal, and an output terminal which, like the output terminal of the first control circuit 102, is coupled to the control terminal of the switch element M1. The second control circuit 104 is configured to keep the switch element M1 in the "off" status by providing the switch signal to the gate of the transistor M1 when the second control signal is at a keep-off level. In the current embodiment, the first control circuit 102, the second control circuit 104, and the corresponding first and second control signals are configured such that the switch element M1 is turned off quickly when the switch signal is provided from the first control circuit 102, and is subsequently kept in the "off" state when the switch signal is provided by the second control circuit 104.

The load switch 100 further includes a controller 106 that provides the first and second control signals respectively to the first and second control circuits 102 and 104, as well as a third control signal to a charge pump 108. An enable signal is provided to the load switch 100 and input to the controller 106. The controller 106 includes two blocks, an enable EN block and a logic block. The EN block and the logic block are used to generate the first through third control signals from the enable signal. The generation and usage of the first through third control signals will be described in more detail below with reference to FIG. 2. In the embodiment shown, the EN block is an input buffer and the logic block comprises a plurality of logic gates used to generate the first through third control signals. Although FIG. 1 shows the controller 106 as including more than one block, in alternative embodiments, the controller 106 may comprise more or fewer blocks, and in some embodiments, the controller 106 may be located outside the load switch. In the embodiment shown, an optional charge pump 108 is coupled between the control terminal and the output terminal of the switch element M1. The charge pump 108 boosts the voltage on the control terminal of the switch element M1 for stabilizing the switching thereof.

The load switch 100 further comprises a JFET 110 connected between the controller 106 and a node located between the drain terminal of the switch element M1 and the supply voltage $V_{USB}$. The JFET 110 converts the supply voltage $V_{USB}$ to power the blocks in the controller 106 and the second control circuit 104.

Figure 2:
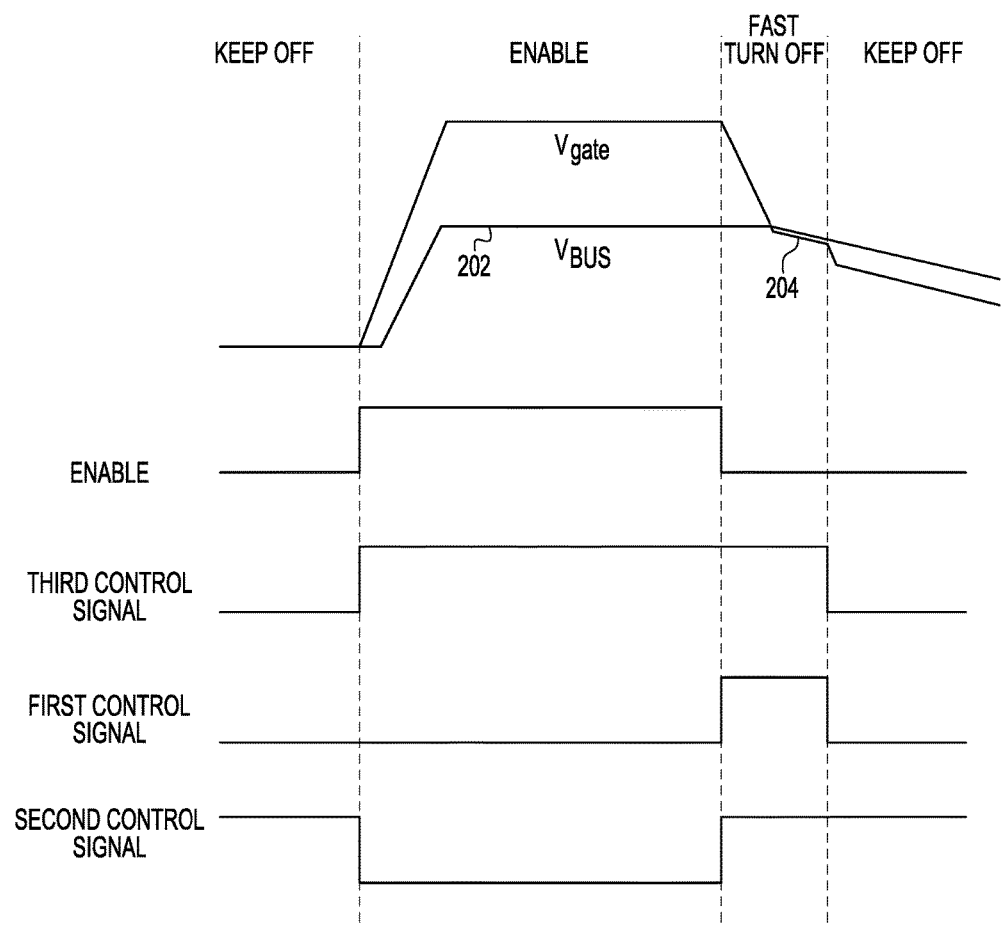
FIG. 2 is a timing diagram of signals of various nodes of the load switch of FIG. 1.

With reference to FIG. 2, a timing diagram of the signals at multiple nodes of the load switch 100, including the enable signal, the first through third control signals, the switch signal, which is the voltage at the gate of the switching element M1 $V_{gate}$, and the output voltage $V_{BUS}$. The enable signal is high when the switch element M1 is to be turned-on. Thus, when the enable signal is high, then the first and second control signals are low, so the fast turn-off circuit 102 generate and the keep-off circuit 104 maintain a voltage at the gate of M1-$V_{gate}$ (i.e., the switch signal) such that the switch element M1 is not turned-off, as indicated at 202 in FIG. 2. When $V_{gate}$ goes high, then $V_{bus}$ also goes high. When the enable signal goes low, which is an indication to turn-off the switch element M1, then the first control signal goes high such that the first control circuit 102 causes the voltage at the gate of M1-$V_{gate}$ (the switch signal) to go down, which turns-off the switch element M1 and $V_{bus}$ also begins to go down. Thus, as can be seen, the first control signal goes high when the enable signal goes low. When the enable signal goes low, the second control signal, like the first control signal, also goes high. In fact, the second control signal is an inverted version of the enable signal. Thus, when the enable signal is high, the second control signal is low, and when the enable signal is low, the second control signal is high. When the second control signal is high, then the switch signal ($V_{gate}$) keeps the switch element M1 turned-off—that is, $V_{gate}$ is low, as indicated at 204 in FIG. 2.

Thus, when the enable signal goes low, there is a "fast turn off" phase in which the controller 106 provides the first and second control signals at a high level to the first and second control circuits 102 and 104. In response to the first control signal at this "turn-off" level, the switch signal provided to the gate terminal of the switch transistor M1 drops to be lower than the output voltage $V_{BUS}$ at the source terminal, which switches off the switch transistor M1. After a predetermined time, the controller 106 drops the first control signal to low, while keeping the second control signal high. Due to the absence of the first control signal, the gate voltage $V_{gate}$ drops further such that $V_{gate}$ is less than the output voltage $V_{BUS}$, as shown at 204 in FIG. 2. Because the second control signal is kept high ("keep-off" level), the switch signal ($V_{gate}$) keeps the switch transistor M1 off. The third control signal provided to the charge pump 108 goes high with the enable signal for stabilizing the switching on of the switch element M1. After the switch element M1 is controlled by the first control signal to be switched off, there's no need to boost the voltage on the control terminal of the switch element M1 to facilitate the switching on of the switch element M1, the third control signal provided to the charge pump 108 goes low.

Figure 3:
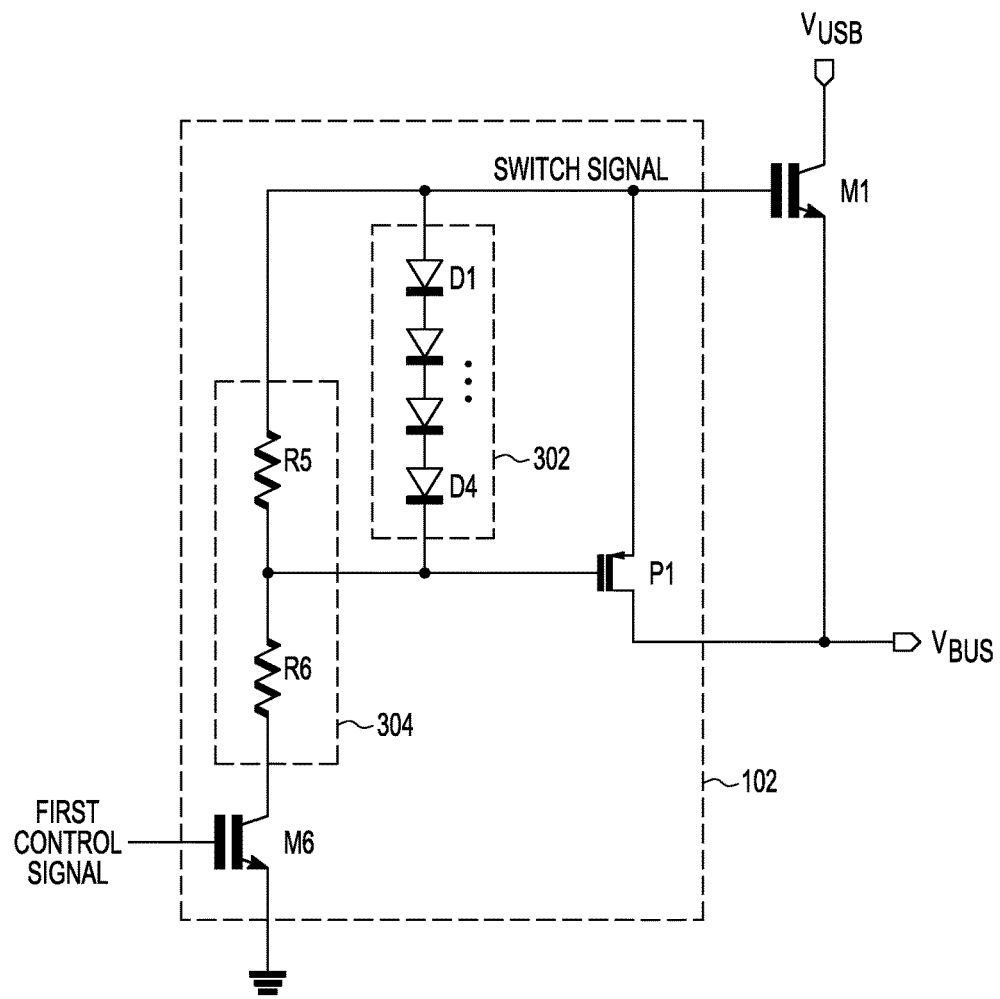
FIG. 3 is a schematic circuit diagram of a first control circuit and a switch element of FIG. 1 in accordance with an embodiment of the present invention.

Referring now to FIG. 3, a circuit diagram of the first control circuit 102 and the switch element M1 of FIG. 1 in accordance with a first embodiment of the present invention is shown. The first control circuit 102 includes a first transistor P1. The first transistor P1 has a gate terminal, a source terminal coupled to the control terminal of the switch element M1, and a drain terminal coupled to the output terminal of the switch element M1. In the current embodiment, the first transistor P1 is a high-voltage PMOS transistor. The source terminal of the first transistor P1 provides the switch signal to the switch element M1.

The first control circuit 102 includes a second transistor M6. The second transistor M6 has a gate terminal coupled to the controller 106 for receiving the first control signal, a drain terminal coupled to the gate terminal of the first transistor P1, and a source terminal coupled to ground. In the current embodiment, the second transistor M6 is an NMOS transistor.

The first control circuit 102 includes a first clamping circuit 302 coupled between the source and gate terminals of the first transistor P1, for clamping a gate-source voltage between the gate and source terminals of the first transistor P1. In the current embodiment, since the first transistor P1 is a PMOS transistor, the gate voltage is lower than the source voltage so that the PMOS transistor P1 will conduct a current therethrough. The first clamping circuit 302 preferably comprise a plurality of serially connected diodes, where an anode of the first diode D1 in the series is coupled to the source terminal of the first transistor P1, and a cathode of the last diode D4 in the series is coupled to the gate terminal of the first transistor P1. It will be understood by those of skill in the art that although the clamping circuit 302 is shown to include four diodes, in alternative embodiments, the clamping circuit 302 may comprise more or fewer diodes.

The first control circuit 102 also includes a voltage control circuit 304. Generally, the voltage control circuit 304 controls a voltage drop from the input voltage $V_{USB}$ to the output voltage $V_{BUS}$. As shown in FIG. 3, the voltage control circuit 304 includes serially connected resistors R5 and R6 coupled between the switch element M1 and the second transistor M6. Further, the gate terminal of the first transistor P1 is coupled to a node between the resistors R5 and R6. It will be understood by those of skill in the art that after the first control signal goes high (to turn-off the switch element M1), the second transistor M6 is turned on (becomes conductive) and subsequently the first transistor P1 and the switch transistor M1 become conductive, the supply voltage $V_{USB}$ is divided by the voltage control circuit 304, and the node between the resistors R5 and R6 generates a divided voltage, which is provided as the output voltage $V_{BUS}$.

Figure 4:
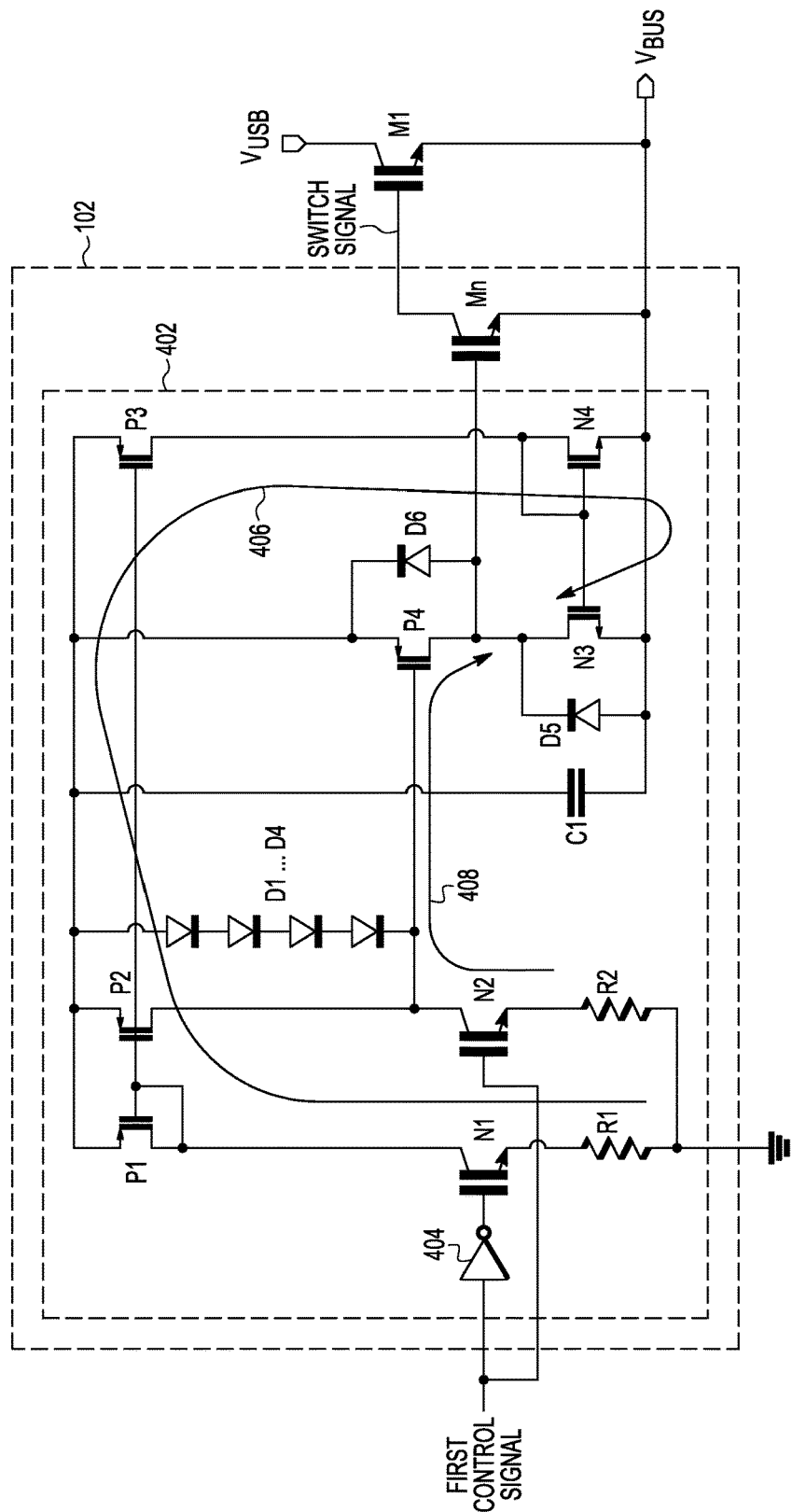
FIG. 4 is a schematic circuit diagram of the first control circuit and the switch element in accordance with another exemplary embodiment of the present invention.

Referring now to FIG. 4, a circuit diagram of the first control circuit 102 and the switch element M1 in accordance with another exemplary embodiment of the present invention is shown. In this embodiment, the first control circuit 102 includes a first transistor Mn. The first transistor Mn has a gate terminal, a drain terminal coupled to the control terminal of the switch element M1, and a source terminal coupled to the output terminal of the switch element M1. Accordingly, the drain terminal of the first transistor Mn provides the switch signal for the switch element M1. In the current embodiment, the first transistor Mn is a high-voltage NMOS transistor. In alternative embodiments, a charge bump (not shown) can be coupled between the gate and source terminals of the first transistor Mn for boosting the gate voltage of the first transistor Mn and stabilizing the switching thereof, like the charge pump 108 coupled to the switch element M1 shown in FIG. 1.

The first control circuit 102 further includes a switching circuit 402 coupled between the gate and source terminals of the first transistor Mn. The switching circuit 402 receives the first control signal and switches on and/or off the first transistor Mn based on the value of the first control signal. In the current embodiment, the switching circuit 402 comprises a level-shifter circuit.

When the first control signal is at a first level, the switching circuit 402 turns-off the first transistor Mn. Subsequently, the first transistor Mn provides the switch signal to the switch element M1 to turn-on the switch element M1. Alternatively, when the first control signal is at a second level, the switching circuit 402 turns-on the first transistor Mn, and subsequently the first transistor Mn provides the switch signal to the switch element M1 to turn-off the switch element M1.

As shown in FIG. 4, the switching circuit 402 further includes a second transistor N1, a third transistor N2, and a fourth transistor P4. Each of the second and third transistors N1 and N2 has a gate terminal that receive reversed versions of the first control signal. That is, the gate terminal of the second transistor N1 is coupled to an output of an inverter 404 whose input is coupled to receive the first control signal, and the gate terminal of the third transistor N2 is coupled to receive the first control signal. In alternative embodiments, the location of the inverter 404 can be exchanged such that the gate of the third transistor N2 is connected to the output of the inverter 404. The sources of the second and third transistors N1 and N2 are connected to ground by way of respective resistors R1 and R2. A gate of the fourth transistor P4 is coupled to a drain of the third transistor N2, and a drain of the fourth transistor P4 is coupled to the gate of the first transistor Mn. A storage capacitor C1 is coupled between the source and drain terminals of the fourth transistor P4.

In the current embodiment, the second and third transistors N1 and N2 are NMOS transistors, while the fourth transistor P4 is a PMOS transistor. Further to the description above, if the first control signal is at the first level, in the current embodiment at a low level, the third transistor N2 is switched off, and subsequently the fourth transistor P4 is switched off, which provide a low-level switch signal at the drain terminal of the fourth transistor P4 to turn-off the first transistor Mn. On the other hand, if the first control signal is at the second level, in the current embodiment at a high level, the third transistor N2 is switched-on, and then the fourth transistor P4 is switched-on. When conductive, the fourth transistor P4 enables the storage capacitor C1 to release its stored charge to the gate of the first transistor Mn such that the fourth transistor P4 provides at its drain terminal a high-level switch signal to the gate terminal of the first transistor Mn to switch-on the first transistor Mn.

The switching circuit 402 further includes multiple transistors P1, P2, P3, N3, and N4. Transistor P1 has its gate and drain terminals connected to the drain terminal of the second transistor N1, and its source terminal is connected to the source terminal of the fourth transistor P4. Transistor P2 has its gate terminal connected to the gate of transistor P1, its source connected to the source of transistor P1, and its drain connected to the drain of the third transistor N2. In addition, the gate of the fourth transistor P4 has its gate connected to a node between the drains of the transistor P2 and the third transistor N2. Transistor P3 has its gate connected to the gate of the transistor P2, its source connected to the source of the transistor P2, and its drain is connected the drain of transistor N4. Transistor N4 has its drain connected to its gate, and its source connected to the output terminal of the switch element M1. Transistor N3 has its source connected to the source of transistor N4 and to the output terminal of the switch element M1, its gate is connected to the gate of transistor N4, and its drain is connected to the drain of the fourth transistor P4. A diode D5 has an anode connected to the output terminal of the switch element M1, and a cathode connected to a node between the drains of the fourth transistor P4 and the transistor N3. There is another diode D6 having an anode connected to a node between the drain of the fourth transistor P4 and the gate of the first transistor Mn, and a cathode connected to the source of the fourth transistor P4.

In the first control circuit 102, the second transistor N1 and the multiple transistors P1, P2, P3, N4, and N3 can be switched to be conductive in a first conductive path, indicated with arrow 406, when the first control signal is low, thereby turning-off the first transistor Mn and turning-on the switch element M1. With reference to FIG. 1, when the first conductive path 406 is conductive, limited current is required from the charge pump 108 to keep the switch signal at the gate terminal of the first transistor Mn low, which enables the load switch 100 to have a relatively low static current.

If the first control signal is high, then the third and fourth transistors N2 and P4 form a second conductive path indicated by arrow 408, such that the first transistor Mn is turned-on, which subsequently switches-off the switch element M1. The second conductive path 408 includes only two transistors N2 and P4, while the first conductive path 406 includes up to 6 transistors. The second conductive path 408 enables the first control signal to be quickly transmitted to the switch element M1 to quickly turn-off the switch transistor M1, as compared with the first conductive path 406. Preferably, the time to turn-off the switch element M1 is less than 100 ns. Similar to the first control circuit 102 shown in FIG. 3, the switching circuit 402 also includes a clamp circuit coupled between the gate and source terminals of the fourth transistor P4. The clamp circuit protects the gate-source voltage of the fourth transistor P4 from being overly large such that it could break the thin oxide layer of the PMOS transistor.

Figure 5:
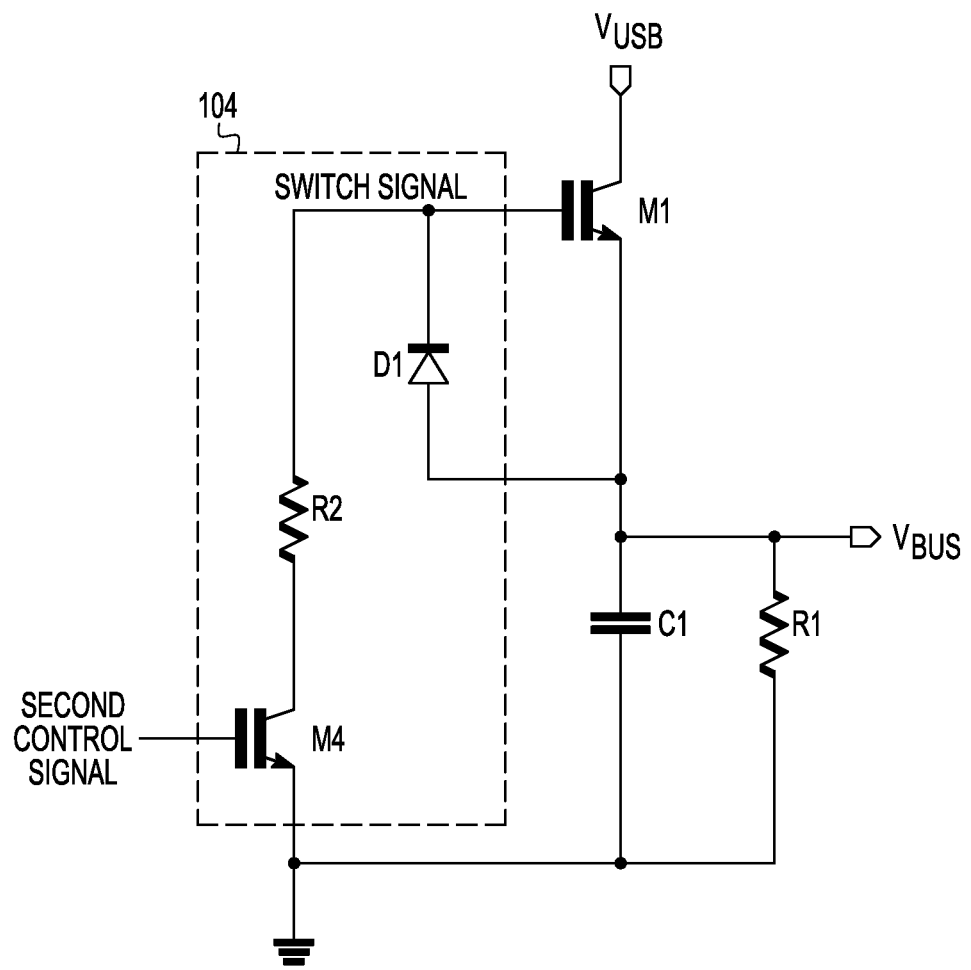
FIG. 5 is a schematic circuit diagram of the second control circuit and the switch element of FIG. 1 in accordance with another embodiment of the present invention.

FIG. 5 illustrates a circuit diagram of the second control circuit 104 in accordance with an exemplary embodiment of the present invention. The second control circuit 104 includes a first transistor M4 and a diode D1. The first transistor M4 has a gate terminal coupled to the controller 106 for receiving the second control signal, a source terminal coupled to the output terminal of the switch element M1 by way of a first resistor R1, and a drain terminal coupled to the control terminal of the switch element M1 by way of a second resistor R2. The diode D1 has an anode coupled to the output terminal of the switch element M1, and a cathode coupled to the gate terminal of the switch element M1. There also is a capacitor C1 connected between the output terminal of the switch element M1 and the source terminal of the first transistor M4.

In the current embodiment, with reference to FIG. 2, after the controller 106 provides the first control signal to the first control circuit 102, which turns-off the switch element M1, the second control signal is provided to the first transistor M4 of the second control circuit 104 to turn-on the first transistor M4. When the first transistor M4 is conductive, it causes the voltage at the gate terminal of the switch transistor M1 to go low, thereby keeping the switch transistor M1 in the off-state. The diode D1 ensures that the gate voltage is lower than the source voltage, and that the switch transistor M1 is stable in the off-state. A typical voltage drop between the source and gate terminals of the switch transistor M1 caused by the diode D1 is about 0.7V. Preferably, the first transistor M4 of the second control circuit 104 is a high-voltage NMOS transistor.

It can now be seen that the embodiments utilize a relatively short conductive path for turning off the switch element of the load switch, which makes the turning-off of the load switch quick enough even though the supply voltage suffers large fluctuation. Besides, the asymmetric level shifter circuit used for switching the switch element requires little current to be pulled from the charge bump when the switch element is turned on. Taking the first control circuit 102 shown in FIG. 4 for example, when the first control signal is at a low level, the second transistor N1 conducts, a resistor R1 coupled to the source terminal of the second transistor N1 secures the current through the second transistor. On the other hand, because the first transistor Mn is turned off, there is no discharge on the gate terminal of the switch transistor M1. The overall consumed current is $2*(V_{in}-V_{gs\_N1})/R1$, wherein $V_{in}$ is the input voltage at the input terminal of the first control circuit 102, $V_{gs\_N1}$ is the gate-source voltage drop of the second transistor N1, and R1 is the resistance of the resistor R1. Accordingly, the resistor R1 can be configured to have a relatively large resistance in order to reduce the overall current consumption. After the switch element M1 is controlled to be turned off, the second control circuit 104 keeps the switch element M1 in the off status. As a result, no power is consumed in the keep-off state.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are intended merely to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

The invention claimed is:

1. A load switch, comprising:
   a switch element comprising a transistor having a drain terminal for receiving an input voltage, a source terminal for providing an output voltage, and a gate terminal for receiving a switch signal, wherein the switch signal turns the switch element on and off;
   a first control circuit having an input terminal for receiving a first control signal and an output terminal coupled to the gate terminal of the switch element, wherein the first control circuit, in response to the first control signal being at a turn-off level, shorts the gate terminal of the switch element to the source terminal of the switch element to turn-off the switch element; and
   a second control circuit having an input terminal that receives a second control signal and an output terminal coupled to the gate terminal of the switch element, wherein the second control circuit, in response to the second control signal being at a keep-off level, provides the gate terminal of the switch element with the switch signal to keep the switch element off, after the first control circuit has provided the switch signal to turn off the switch element.

2. The load switch of claim 1, wherein the first control circuit comprises:
   a first transistor having a gate terminal, a source terminal coupled to the gate terminal of the switch element for providing the switch signal thereto, and a drain terminal coupled to the source terminal of the switch element;
   a second transistor having a gate terminal that receives the first control signal, a drain terminal coupled to the gate terminal of the first transistor, and a source terminal.

3. The load switch of claim 2, wherein the first control circuit further comprises a first clamping circuit coupled between the source and gate terminals of the first transistor.

4. The load switch of claim 3, wherein the first clamping circuit comprises a plurality of serially connected diodes, wherein an anode of a first diode is coupled to the source terminal of the first transistor, and a cathode of a last diode is coupled to the gate terminal of the first transistor.

5. The load switch of claim 2, wherein the first transistor is a high-voltage PMOS transistor, and the second transistor is a NMOS transistor.

6. The load switch of claim 1, wherein the first control circuit comprises:
   a first transistor having a gate terminal, a drain terminal coupled to the gate terminal of the switch element for providing the switch signal thereto, and a source terminal coupled to the source terminal of the switch element;
   a switching circuit coupled between the gate and source terminals of the first transistor, wherein the switching circuit receives the first control signal, and is configured to:
   in response to the first control signal being at a first level, turn off the first transistor to provide the switch element with the switch signal that turns on the switch element; and
   in response to the first control signal being at a second level, turn on the first transistor to provide the switch element with the switch signal that turns off the switch element.

7. The load switch of claim 6, wherein the first transistor is a high-voltage NMOS transistor, and the switching circuit is a level-shifter circuit.

8. The load switch of claim 6, wherein the switching circuit comprises:
   a second transistor having a gate terminal;
   a third transistor having a gate terminal and a drain terminal; and
   a fourth transistor having a gate terminal coupled to the drain terminal of the third transistor, and a drain terminal coupled to the gate terminal of the first transistor;
   wherein the gate terminals of the second and third transistors receive inverted versions of the first control signal.

9. The load switch of claim 8, wherein:
   in response to the first control signal being at the first level, the switching circuit turns off the fourth transistor, which turns off the first transistor; and
   in response to the first control signal being at the second level, the switching circuit turns on the fourth transistor, which turns on the first transistor.

10. The load switch of claim 8, wherein the switching circuit further comprises multiple transistors coupled between a drain terminal of the second transistor and the drain terminal of the fourth transistor, wherein the multiple transistors are turned on in response to the first control signal being at the first level.

11. The load switch of claim 6, wherein the first control circuit further comprises a charge pump circuit coupled between the gate and source terminals of the first transistor, wherein the charge pump circuit boosts a voltage of the switching circuit.

12. The load switch of claim 1, further comprising a charge pump circuit coupled between the gate terminal and the source terminal of the switch element.

13. A load switch, comprising:
   a switch element having an input terminal for receiving an input voltage, an output terminal for providing an output voltage, and a control terminal for receiving a switch signal that turns the switch element on and off;
   a first control circuit having an input terminal that receives a first control signal and an output terminal coupled to the control terminal of the switch element, wherein the first control circuit, in response to the first control signal being at a turn-off level, provides the control terminal of the switch element with the switch signal to turn-off the switch element; and
   a second control circuit having an input terminal that receives a second control signal and an output terminal coupled to the control terminal of the switch element, wherein the second control circuit, in response to the second control signal being at a keep-off level, provides the control terminal of the switch element with the switch signal to keep the switch element off after the first control circuit has provided the switch signal to turn-off the switch element,
   wherein the second control circuit comprises:
   a first transistor having a gate terminal that receives the second control signal, a drain terminal coupled to the control terminal of the switch element, and a source terminal coupled to the output terminal of the switch element; and
   a diode coupled between the control and output terminals of the switch element,
   wherein:
   the switch element is an NMOS transistor having a gate configured as the control terminal of the switch element, a drain configured as the input terminal of the switch element, and a source configured as the output terminal of the switch element; and
   an anode of the diode is coupled to the source of the NMOS transistor, and a cathode of the diode is coupled to the gate of the NMOS transistor.

14. The load switch of claim 13, wherein the first transistor is switched on in response to the second control signal being at the keep-off level, and provides the switch signal at the drain terminal thereof, which keeps the switch element off.

15. The load switch of claim 13, wherein the first transistor and the switch element are high-voltage NMOS transistors.

* * * * *